(12) United States Patent
Kashima et al.

(10) Patent No.: US 10,870,444 B2
(45) Date of Patent: Dec. 22, 2020

(54) CONTROL APPARATUS FOR POWER STEERING APPARATUS AND POWER STEERING APPARATUS USING THE SAME

(71) Applicant: HITACHI AUTOMOTIVE SYSTEMS, LTD., Hitachinaka (JP)

(72) Inventors: Masaki Kashima, Novi, MI (US); Yoshitaka Sugiyama, Machida (JP); Masaki Itabashi, Atsugi (JP); Tadashi Suganuma, Atsugi (JP); Kazuya Yamano, Yamato (JP)

(73) Assignee: HITACHI AUTOMOTIVE SYSTEMS, LTD., Hitachinaka (JP)

( * ) Notice: Subject to any disclaimer, the term of this patent is extended or adjusted under 35 U.S.C. 154(b) by 191 days.

(21) Appl. No.: 16/079,491

(22) PCT Filed: Jan. 27, 2017

(86) PCT No.: PCT/JP2017/002918
§ 371 (c)(1),
(2) Date: Aug. 23, 2018

(87) PCT Pub. No.: WO2017/145640
PCT Pub. Date: Aug. 31, 2017

(65) Prior Publication Data
US 2019/0047614 A1 Feb. 14, 2019

(30) Foreign Application Priority Data
Feb. 25, 2016 (JP) .................................. 2016-034015

(51) Int. Cl.
*B62D 5/04* (2006.01)
*H02P 6/28* (2016.01)
(Continued)

(52) U.S. Cl.
CPC ........ *B62D 5/0463* (2013.01); *H02M 7/5387* (2013.01); *H02M 7/5395* (2013.01);
(Continued)

(58) Field of Classification Search
CPC .......... H02P 27/08; H02P 21/00; H02P 21/22; B60L 2240/421
See application file for complete search history.

(56) References Cited

U.S. PATENT DOCUMENTS

2007/0013333 A1* 1/2007 Ajima ....................... H02P 6/18
318/432
2010/0250067 A1* 9/2010 Matsumura ............. H02P 21/16
701/41

FOREIGN PATENT DOCUMENTS

JP 2001-333591 A 11/2001
JP 2001333591 A * 11/2001
(Continued)

OTHER PUBLICATIONS

Translation of JP2001333591A.*
Translation of JP2010041877A.*

*Primary Examiner* — Zoheb S Imtiaz
(74) *Attorney, Agent, or Firm* — Foley & Lardner LLP

(57) ABSTRACT

Provided is a control apparatus for a power steering apparatus, and a power steering apparatus using it that can reduce electromagnetic noise with the aid of a spread spectrum, thereby realizing stabilized motor control. The control apparatus for the power steering apparatus includes a PWM carrier period setting portion configured to set a natural number of PWM carrier periods within one period of a control period and also changeably set a length of the PWM carrier period, a motor current detection execution portion configured to detect a motor current during the control period, a motor rotational angle detection execution portion configured to detect a motor rotational angle during the
(Continued)

control period, and an execution timing setting portion configured to set a timing at which the motor current is detected by the motor current detection execution portion or a timing at which the motor rotational angle is detected by the motor rotational angle detection execution portion, based on the control period set by the control period setting portion.

13 Claims, 9 Drawing Sheets

(51) Int. Cl.
*H02P 27/08* (2006.01)
*H02M 7/5387* (2007.01)
*H02M 7/5395* (2006.01)
*H02P 21/22* (2016.01)
*H02P 25/03* (2016.01)
*H02P 21/06* (2016.01)
*H02P 21/13* (2006.01)
*H02P 27/12* (2006.01)
*H03H 17/02* (2006.01)
*H02M 1/44* (2007.01)

(52) U.S. Cl.
CPC ............... *H02P 6/28* (2016.02); *H02P 21/06* (2013.01); *H02P 21/13* (2013.01); *H02P 21/22* (2016.02); *H02P 25/03* (2016.02); *H02P 27/08* (2013.01); *H02P 27/12* (2013.01); *H03H 17/02* (2013.01); *H02M 1/44* (2013.01); *H02M 7/53871* (2013.01)

(56) References Cited

FOREIGN PATENT DOCUMENTS

| JP | 2007-152994 A | | 6/2007 |
| JP | 2009-247110 A | | 10/2009 |
| JP | 2010-041877 A | | 2/2010 |
| JP | 2010041877 A | * | 2/2010 |
| JP | 2010-221856 A | | 10/2010 |
| JP | 2013-038916 A | | 2/2013 |

* cited by examiner

CONTROL APPARATUS FOR POWER STEERING APPARATUS AND POWER STEERING APPARATUS USING THE SAME

TECHNICAL FIELD

The present invention relates to a power steering apparatus, and, in particular, to a control apparatus for use in the power steering apparatus.

BACKGROUND ART

A power steering apparatus uses a motor that provides a steering force to a steering mechanism for turning a turning target wheel according to a steering operation performed on a steering wheel, and generates an assist steering torque. A power conversion apparatus for converting direct-current power from a direct-current circuit to alternating-current power, which drives and controls this motor, employs a conversion method that provides an alternating current to a wiring while controlling switching timings of a Hi-side switching element and a Lo-side switching element in a three-phase bridge circuit so as to prevent short-circuiting. The three-phase bridge circuit includes a plurality of phases including one or more winding(s) (load). The Hi-side switching element is connected between each phase and a supply voltage, and a Lo-side switching element is connected between each phase and a GND. As this control method, a voltage to be provided to an alternating-current circuit is controlled by adjusting switching-on/off times (a pulse width) thereof (PWM control) if, for example, a voltage of the supplied direct-current power is constant. The PWM control uses a reference period signal generally called a carrier (a carrier wave), and determines the switching-on/off timings in such a manner that a total of the switching-on/off times allows a desired voltage to be applied during the period of this carrier.

However, such a power conversion apparatus is subject to a problem of switching noise and electromagnetic noise (EMI) due to the switching. Frequency characteristics of them are determined based on a period of the switching, i.e., a carrier frequency.

Examples of measures against it include adding a filtering circuit for reducing transitional responsiveness of the switching in terms of hardware, and setting the carrier frequency so as to avoid a problematic frequency band in terms of software. However, there are limitations on the setting of the carrier frequency, which require the carrier frequency to be set so as to prevent responsiveness of the current with respect to the voltage of the load from exceeding the PWM carrier frequency, and the carrier frequency to be set to such a frequency that the switching noise falls outside a human audible band (20 Hz to 20 kHz). Further, in the switching, a time during which both the Hi-side switching and the Lo-side switching are switched off (a switching loss), which is generally called a dead time, is prepared so as to avoid the short-circuiting from the supply voltage to the GND as described above, and the carrier frequency also should be set so as to reduce this loss as much as possible. Under these limitations, the carrier frequency is set to around 20 kHz for the electric power steering.

However, the problem of the electromagnetic noise still remains even with these limitations satisfied, and not only hardware measures but also software measures should be taken in consideration of price competition, which leads to proposal of a method that spreads a spectrum by changing the carrier frequency per some predetermined period or randomly so as to reduce a peak of electromagnetic energy switched at the set carrier frequency.

Japanese Patent Application Public Disclosure No. 2013-38916 (PTL1) discusses a background art in the present technical field. PTL 1 aims to provide a switching apparatus capable of stabilizing a control target and satisfying specifications of a harmonic current and electromagnetic noise even when a spectrum of a switching frequency is spread, and discloses a switching apparatus that transmits an operation signal for controlling ON/OFF to a switching element to control switching of the switching element. A configuration of this switching apparatus includes a pulse period selection means for selecting two or more kinds of pulse periods from a plurality of kinds of pulse periods, a control period setting means for setting, as a control period, a total of the pulse periods selected by the pulse period selection means, and an operation signal transmission means for transmitting the operation signal by changing a duty ratio of ON and OFF per control period set by the control period setting means.

CITATION LIST

Patent Literature

PTL 1: Japanese Patent Application Public Disclosure No. 2013-38916

SUMMARY OF INVENTION

Technical Problem

In PTL 1, the switching apparatus is configured to employ a constant control period, and, under this limitation, set the total of the plurality of kinds of PWM carrier periods as the control period and set an integer multiple of this control period as a modulation period of the plurality of kinds of PWM carrier periods.

Now, in recent years, especially electric power steering apparatuses have been expected to have high responsiveness so as to be able to realize improvement of a steering feeling and stabilized control even at the time of emergency avoidance, and target responsiveness of the current control of the motor used in the electric power steering apparatus may be required to satisfy, for example, 1 msec. Therefore, as the motor control period therefor, for example, a calculation of the application voltage is required to be updated approximately five times or more, i.e., the control period is required to be repeated approximately five or more times (one period is ⅕ msec or less) within this target responsiveness. Further, in the case where the carrier frequency is set to 20 kHz so as to fall outside the audible band, the PWM carrier period is repeated twenty times within the target responsiveness of 1 msec. In other words, four PWM carrier periods can be contained in one control cycle at most. However, in a case where the PWM carrier period is changed among the four PWM carrier periods, this change necessitates such an adjustment that, when a short period is prepared as even only one of the four periods, the remaining periods necessarily have to be set to long periods so as not to change a total time of the four PWM carrier periods (the control period) and so as to spread the desired spectrum. Therefore, in such a case, it is impossible to largely shift an average value of the carrier frequency during the control period under the limitation accompanied by the employment of the fixed control period, and, further, there is such a problem that, when an amplitude of the frequency is increased, each one of the plurality of kinds of PWM carrier periods inconveniently has a long length.

Further, the carrier frequency may also be changed for a purpose other than the spread spectrum, and, for example, the carrier frequency may be set to a lower frequency so as to reduce the switching loss due to the above-described dead time as much as possible in a driving state that a motor output is maximized. In such a case, under the above-described limitations in the electric power steering apparatus, PTL 1 unintentionally leads to, for example, creation of one control cycle from two PWM carrier periods with the carrier frequency set to 10 kHz, thereby being able to prepare only two kinds of PWM carrier periods.

Further, the configuration of the above-described patent literature, PTL 1 is restated as a configuration in which the PWM carrier period is changed a plurality of times with respect to one control period (a voltage update period), and therefore involves a problem of being unable to stably apply a desired voltage. Further, when the carrier frequency is desired to be largely changed, PTL 1 causes a shock of the current when the frequency is switched because being unable to smoothly change the frequency, and cannot allow a flexible design of a desired change in the frequency to reduce the electromagnetic noise.

Further, PTL 1 does not include an update of the switching timing due to the change in the PWM carrier period during the control period, and therefore cannot apply the desired voltage and thus cannot realize the desired current control responsiveness, resulting in occurrence of a current vibration according to the change in the PWM carrier period changing during the control period. Even if, as a method for avoiding it, the switching apparatus is designed to generate an interrupt task shorter than the control period and synchronized with the PWM carrier period and update the switching timing according to the PWM carrier period in this task, this raises a problem of complicating a design of a microcomputer and further undesirably increasing a calculation load on the microcomputer.

An object of the present invention is to provide a control apparatus for a power steering apparatus, and a power steering apparatus using it that can solve the above-described problems and reduce the electromagnetic noise with the aid of the spread spectrum, thereby realizing the stabilized motor control.

Solution to Problem

To achieve the above-described object, one example of one aspect of the present invention is a control apparatus for a power steering apparatus. The control apparatus is configured to drive and control a motor configured to provide a steering force to a steering mechanism configured to turn a turning target wheel according to a steering operation performed on a steering wheel. The control apparatus includes a current instruction value calculation portion configured to calculate a current instruction value directed to the motor according to a driving condition of a vehicle, a voltage instruction value calculation portion configured to calculate a voltage instruction value directed to the motor based on the current instruction value, a PWM control portion configured to output a PWM duty signal to each phase of the motor according to the voltage instruction value, a bridge circuit including a switching element configured to be driven and controlled by the PWM duty signal, and configured to drive and control the motor, a control period setting portion configured to changeably set a control period, which is a period based on which the control apparatus performs a control operation, a carrier frequency setting portion configured to set a natural number of PWM carrier periods, each of which is a period based on which the WM duty signal is switched between on and off, within one period of the control period, and also configured to changeably set a length of the PWM carrier period, a current detection portion configured to detect a motor current, which is a current flowing in the motor, during the control period, a rotational angle detection portion configured to detect a motor rotational angle, which is a rotational angle of a rotor of the motor, during the control period, and a detection timing setting portion configured to set a timing at which the motor current is detected by the current detection portion or a timing at which the motor rotational angle is detected by the rotational angle detection portion, based on the control period set by the control period setting portion.

According to the one aspect of the present invention, it is possible to provide a control apparatus for a power steering apparatus, and a power steering apparatus using it that can reduce the electromagnetic noise with the aid of the spread spectrum, thereby realizing the stabilized motor control.

DESCRIPTION OF EMBODIMENTS

In the following description, an embodiment of the present invention will be described with reference to the drawings.

Embodiment

The present embodiment is configured to set one control period to an integral multiple of a carrier period without employing a constant control period. Then, the present embodiment is configured to carry out a calculation for determining the carrier period in the next control period before calculating a voltage instruction value that is an output of a voltage instruction value calculation portion in the present control period, and update an operation amount and a parameter per motor control period according to a change between the previous, present, and next control period, so as not to impair controllability even when the control period is changed.

Figure 1:
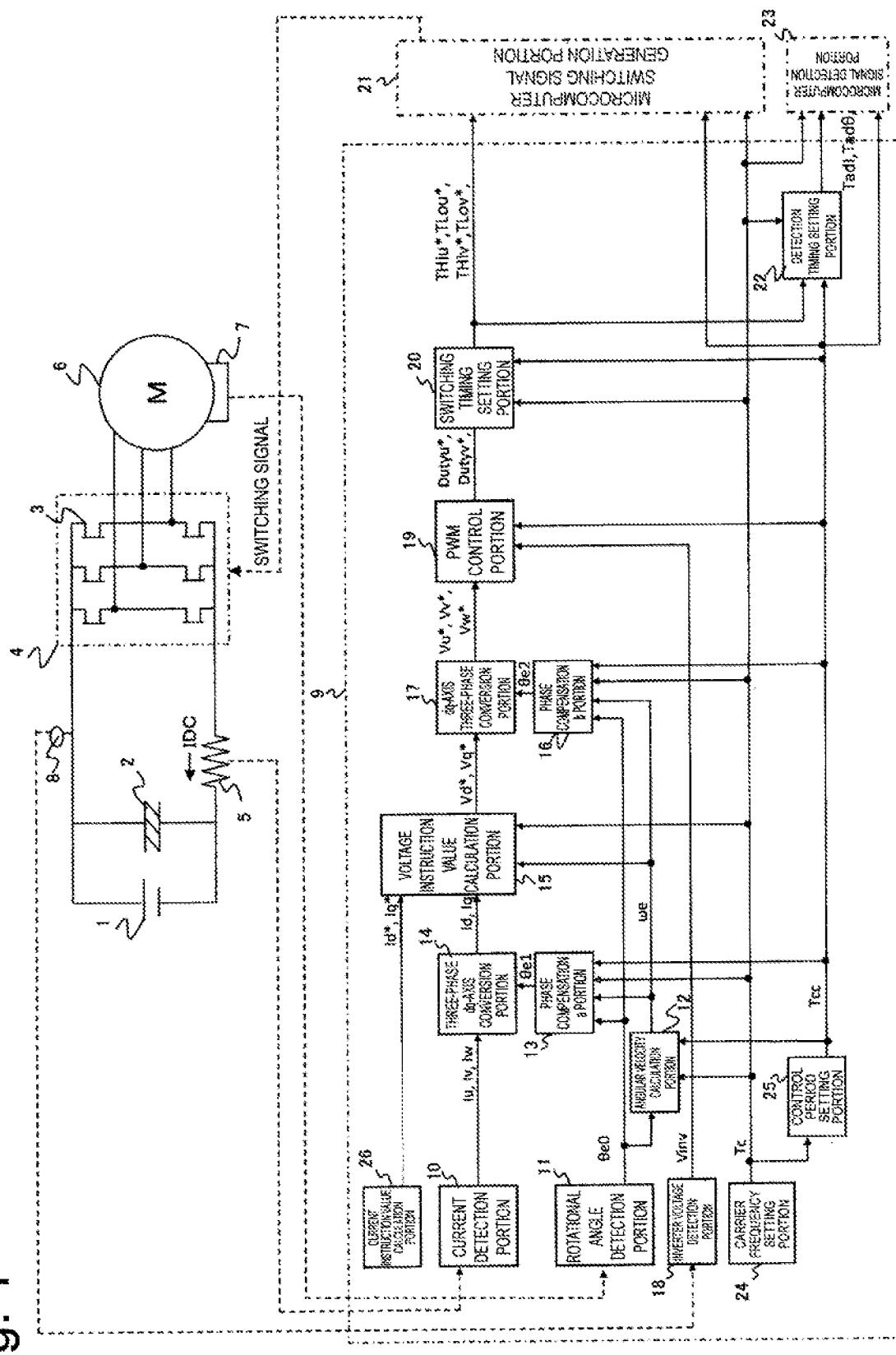
FIG. 1 is a system configuration diagram illustrating a motor and a power conversion apparatus of a power steering apparatus, and a control apparatus for the power steering apparatus according to an embodiment.

FIG. 1 is a system configuration diagram illustrating a motor and a power conversion apparatus of a power steering apparatus, and a control apparatus for the power steering apparatus according to the present embodiment. In FIG. 1, a motor 6 is connected via a power conversion apparatus (an inverter) including a direct-current power source 1, a smoothing capacitor 2 connected in parallel, and a three-phase bridge circuit 4 including six switching elements 3 such as FETs. A shunt resistance 5 is provided on a downstream side between the smoothing capacitor 2 and the three-phase bridge circuit 4. The motor 6 includes a rotor angle sensor 7, an inverter voltage sensor 8, and a control apparatus 9.

The control apparatus 9 receives a downstream-side direct-current bus bar current IDC flowing in the shunt resistance 5 as an input thereto. A current detection portion 10 reproduces three-phase currents Iu, Iv, and Iw flowing in the motor based on IDC. A rotational angle detection portion 11 acquires a motor electric angle $\theta e0$ by receiving a signal from the rotor angle sensor 7. An angular velocity calculation portion 12 outputs an electric angular velocity $\omega e$ from a difference between a present value and a previous value of $\theta e0$. A phase compensation a portion 13 outputs $\theta e1$ by correcting the electric angle in consideration of a time lag between a current detection timing and a rotational angle detection timing as if the rotational angle is detected at the current detection timing. A three-phase dq-axis conversion portion 14 outputs a magnetic flux (d axis) current Id and a torque (q axis) current Iq by applying a coordinate conversion for vector control that replaces three-phase alternating currents with two-axis direct currents with use of the above-described currents Iu, Iv, and Iw and the above-described electric angle $\theta e1$.

A current instruction value calculation portion 26 calculates a current instruction value directed to the motor 6 according to a driving condition of a vehicle. A voltage instruction value calculation portion 15 outputs a d-axis instruction voltage Vd* and a q-axis instruction voltage Vq*, which are voltage instruction values directed to the motor 6, in such a manner that the above-described currents Id and Iq follow instruction currents Id* and Iq* of the current instruction value calculation portion 26, with use of the above-described currents Id*, Iq*, Id, and Iq, and angular velocity $\omega e$. A phase compensation b portion 16 outputs $\theta e2$ by correcting the electric angle in consideration of a time lag between a voltage output timing and the rotational angle detection timing as if the rotational angle is detected at the voltage output timing, and a dq-axis three-phase conversion portion 17 outputs three-phase voltage instructions Vu*, Vv*, and Vw* by applying a coordinate conversion so as to return the two-axis direct currents for the vector control into the actual three-phase alternating currents with use of the above-described voltages Vd* and Vq* and the above-described electric angle $\theta e2$.

An inverter voltage detection portion 18 acquires an inverter voltage Vinv by receiving a signal from the inverter voltage sensor 8. A PWM control portion 19 outputs three-phase instruction Duty ratios Dutyu*, Dutyv*, and Dutyw*, each of which is a PWM duty signal directed to each phase, from a ratio between Vu*, Vv*, and Vw*, and Vinv. A switching timing setting portion 20 outputs switching timings THiu*, TLou*, THiv*, TLov*, THiw*, and TLow* of three-phase Hi-side/Lo-side switches for each of them by comparing Dutyu*, Dutyv*, and Dutyw*, and a PWM carrier period Tc. A microcomputer switching signal generation portion 21 provides switching signals to the six switching elements 3 based on the PWM carrier period Tc as a time base.

Then, a detection timing setting portion 22 sets detection timings TadI, Tad$\theta$, and TadV at which the above-described current IDC, rotational angle, and inverter voltage are detected from THiu*, TLou*, THiv*, TLov*, THiw*, and TLow*, and a microcomputer signal detection portion 23 detects signals at TadI, Tad$\theta$, and TadV based on signals synchronized with a control period generated from the PWM carrier period Tc.

The angular velocity $\omega e$ calculated by the angular velocity calculation portion 12 may become vibratory if there is a detection error component in the motor electric angle $\theta e0$ detected by the rotor angular velocity sensor 7. In such a case, the angular velocity calculation portion 12 includes filtering processing that removes a vibratory component of the angular velocity $\omega e$ by providing a digital filtering processing portion to the angular velocity $\omega e$. Now, the digital filtering processing portion can function as intended by setting, based on the control period, a cutoff frequency used when the filtering processing is performed. This configuration allows the control apparatus to also adjust the cutoff frequency according to the changing control period, thereby carrying out appropriate digital filtering.

A carrier frequency setting portion 24 selects one of a plurality of kinds of PWM carrier periods Tc prepared in advance, based on which the present embodiment is constructed. A control period setting portion 25 generates a control period Tcc as an integer multiple of the PWM carrier period Tc selected by the carrier frequency setting portion 24. Then, the PWM carrier period Tc and the control period Tcc are output to the angular velocity calculation portion 12, the phase compensation a portion 13, the voltage instruction value calculation portion 15, the phase compensation b portion 16, the switching timing setting portion 20, the microcomputer switching signal generation portion 21, the detection timing setting portion 22, and the microcomputer signal detection portion 23, which depend on the control period Tcc, i.e., the PWM carrier period Tc.

The phase compensation a portion 13 is a motor rotational angle estimation portion, which estimates the motor rotational angle when the motor current is detected by the current detection portion 10, based on the control period Tcc set by the control period setting portion 25 and the motor rotational angle detected by the rotational angle detection portion 11. Then, a current instruction portion calculates the current instruction value based on the motor current and the motor rotational angle when the motor current is detected. Conventionally, the motor current and the motor rotational angle have been detected at different timings from each other, so that, at the time of the detection of the motor current, the motor rotational angle at this time has been unable to be determined. Therefore, by retrospectively estimating the motor rotational angle when the motor current has been detected, based on the motor rotational angle detected after that and the control period, the control apparatus can acquire information of the motor rotational angle at the motor current detection timing, thereby calculating the appropriate current instruction value.

Figure 2:
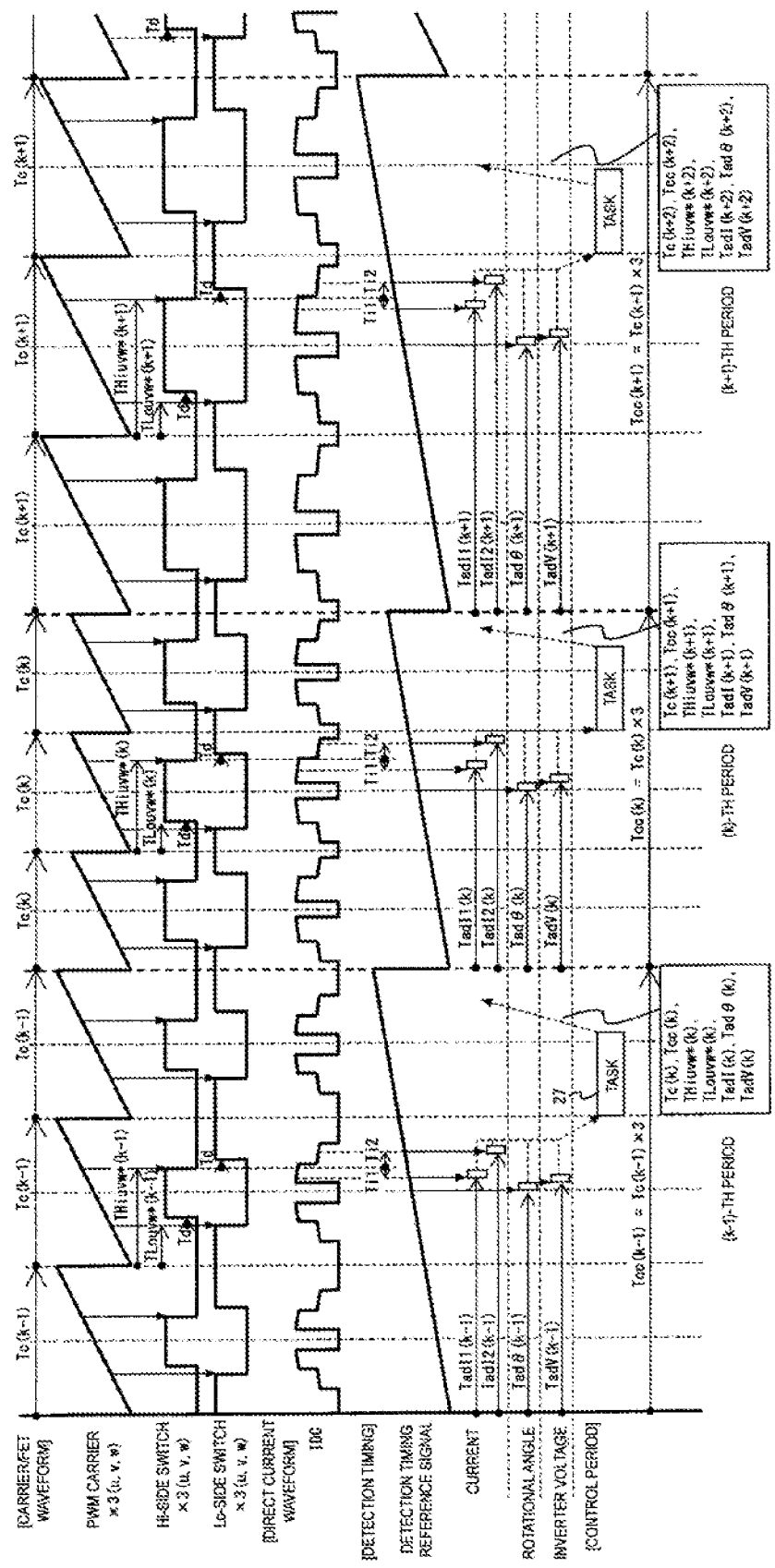
FIG. 2 is a timing chart of the control apparatus according to the embodiment.

FIG. 2 is a timing chart indicating the PWM carrier period, the switching timings of the switching elements, and the like of the control apparatus according to the present embodiment. In FIG. 2, k indicates what number period this control period is (k: a natural number). In this example, the control period Tcc is set to (synchronized with) a triple of the PWM carrier period Tc. In other words, a carrier frequency during one control period is fixed during three PWM carrier periods, and the input signal detected and the output signal calculated for the control are not updated during the one control period. Further, the output signal is reflected in the next control period. A task 27 is a control task that performs the processing of the control apparatus 9 illustrated in FIG. 1 during the one control period. Inputs of the task 27 are signal values acquired during the present control period, and outputs of the task 27 are the PWM carrier period and control period Tc and Tcc, the switching timings THiu*, THiv*, THiw*, TLou*, TLov*, and TLow* of the Hi-side switches and Lo-side switches of the three phases, and the timings TadI, Tadθ, and TadV at which the current, the rotational angle, and the inverter voltage are detected illustrated in FIG. 1, which are acquired in the next control period. A reference point regarding each of the timings will be clarified now. Regarding the switching timings THiu*(k), THiv*(k), THiw*(k), TLou*(k), TLov*(k), and TLow*(k) of the Hi/Lo-side switches in the present control period, an OFF timing is generated for both the Hi-side and the Lo-side according to a timing calculated based on a beginning of each PWM carrier Tc(k) during the present control period (k), and an On timing is automatically generated after a dead time Td has elapsed. Now, the dead time Td is fixed without depending on the PWM carrier period.

Timings Tad1(k) and Tad2(k) at which the currents are detected in the present control period are calculated and determined to be respectively a timing earlier by a time Ti1 and a timing later by a time Ti2 than the Hi-side OFF timing of a phase associated with the Hi-side switch corresponding to a middle timing of the three phases (a timing that is a middle timing when THiu*, THiv*, and THiw* are arranged in descending order) in the second period of the PWM carrier during the present control period (k), based on a beginning of a detection reference signal synchronized with the control period Tcc(k) during the present control period (k). Now, Ti1 and Ti2 are times determined in advance according to a circuit characteristic in the method for reproducing the three-phase currents from the direct current IDC at the shunt resistance on the direct-current bus bar, and are fixed without depending on the PWM carrier period.

A timing Tadθ(k) at which the rotational angle is detected in the present control period is set to a middle of the second period of the PWM carrier during the present control period (k) based on a beginning of a detection timing reference signal synchronized with the control period Tcc(k) during the present control period. A timing TadV(k) at which the inverter voltage is detected in the present control period is set in such a manner that the signal is detected sequentially after the timing Tadθ(k) at which the rotational angle is detected.

Next, the present embodiment will be described indicating exemplary implementation of a calculation using the PWM carrier period for preventing deterioration of controllability even when the control period is changed, which is a characteristic of the present embodiment, with respect to respective operation amounts and parameters of the angular velocity calculation portion 12, the phase compensation a portion 13, the voltage instruction value calculation portion 15, the phase compensation b portion 16, the switching timing setting portion 20, and the detection timing setting portion 22 illustrated in FIG. 1, and further indicating exemplary implementation of the carrier frequency that realizes a spread spectrum at the carrier frequency setting portion 24 and specifications of modulation thereof.

Figure 3:
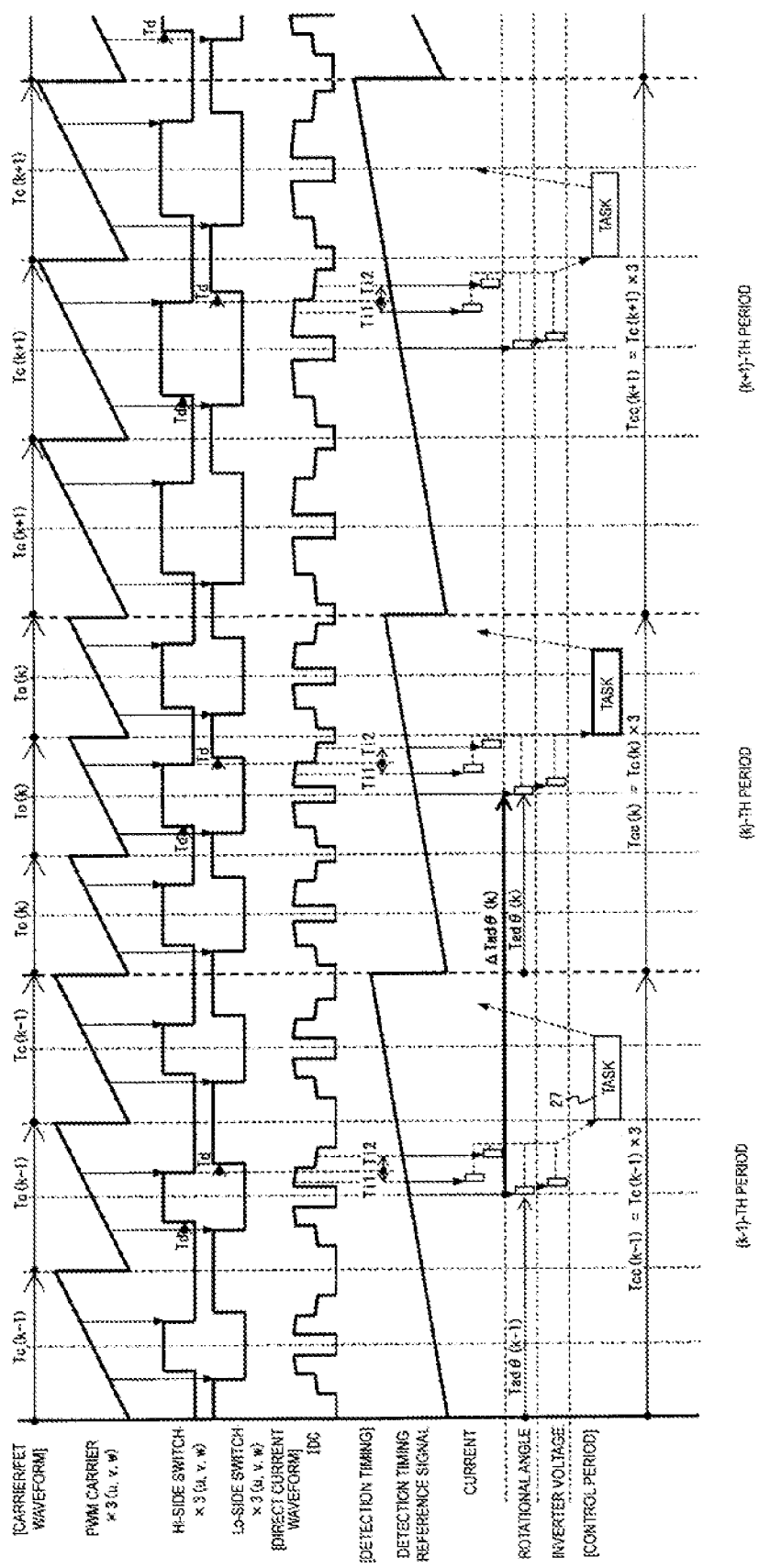
FIG. 3 is a timing chart relating to a calculation of an angular velocity according to the embodiment.

First, regarding the angular velocity calculation portion 12, the angular velocity can be calculated in a discrete system from a difference value between the rotational angle detected in the present control period and the rotational angle detected in the previous control period, and an interval between the times when they are detected. In other words, this interval between the times when they are detected depends on the control period, and an appropriate angular velocity can be acquired as long as the previous control period and the present control period are known. (Now, an update of the carrier period of the next control period does not have to be carried out before the angular velocity calculation portion.) Therefore, the angular velocity ωe(k) to be used during the present control period is calculated from a difference (a differential) between a motor electric angle θe0(k−1) acquired during the previous control period and a motor electric angle θe0(k) acquired during the present control period. However, in the discrete system, due to the control period acquiring the changeability, the following consideration should be added so as to make a time coefficient ΔTadθ(k) thereof changeable in the differential calculation. FIG. 3 illustrates a timing chart relating to the calculation of the angular velocity. The following equations are derived from FIG. 3.

$$\omega e'(k)[\text{rad}/\Delta Tad\theta(k)\text{sec}] = (\theta e0(k)[\text{rad}] - \theta e0(k-1)[\text{rad}])$$

$$\omega e(k)[\text{rad}/sec] = (\theta e0(k)[\text{rad}] - \theta e0(k-1)[\text{rad}]) \div \Delta Tad\theta(k)[\text{sec}]$$
$$= (\theta e0(k)[\text{rad}] - \theta e0(k-1)[\text{rad}]) \div$$
$$\{(Tcc(k-1)[\text{sec}] - Tad\theta(k-1)[\text{sec}]) + Tad\theta(k)[\text{sec}]\}$$
$$= (\theta e0(k)[\text{rad}] - \theta e0(k-1)[\text{rad}]) \div$$
$$\left(\frac{1}{2} \times Tcc(k-1)[\text{sec}] + \frac{1}{2} \times Tcc(k)[\text{sec}]\right)$$

Then, in the present embodiment, the following equation is also derived. ½×Tcc(k)[sec]=Tadθ(k)[sec]. Further, in the case where the angular velocity ωe(k) is vibratory, the filtering calculation is carried out every time the angular velocity ωe(k) is calculated (a sampling period T=the control period Tcc). A coefficient Kf(k) determining the cutoff frequency in the discrete system is acquired with use of the present control period and a target cutoff frequency fc, and an angular velocity signal ωef(k) after the filtering is calculated by applying a digital filter in the following manner.

$$\omega ef(k)[\text{rad}/\text{sec}] =$$
$$Kf(k)[-] \times \{\omega e(k)[\text{rad}/\text{sec}] - \omega ef(k-1)[\text{rad}/\text{sec}]\} + \omega ef(k-1)[\text{rad}/\text{sec}] =$$
$$\{(2\pi \times fc[\text{Hz}] \times Tcc[\text{sec}]) \div (1 + 2\pi \times fc[\text{Hz}] \times Tcc[\text{sec}])\} \times$$
$$\{\omega e(k)[\text{rad}/\text{sec}] - \omega ef(k-1)[\text{rad}/\text{sec}]\} + \omega ef(k-1)[\text{rad}/\text{sec}]$$

Next, the phase compensation a portion 13 and the phase compensation b portion 16 will be described.

First, there is a plurality of methods for detecting the current in the power conversion apparatus, but any of them places importance on the setting of the detection timing synchronized with the control period or the switching timing. For example, in a system that includes a shunt provided to a phase to detect the current, the detection timing is set during the present control cycle to a middle or a latter half of the next control period, i.e., a period during which the desired voltage is constantly applied.

Further, in a current detection system that includes one shunt provided to a direct-current circuit in front of or at the back of the three-phase bridge circuit, which is a different detection method, the current detection timing is set during the present control cycle to a timing in synchronization with the switching timing set for the next control period during which the desired voltage is applied. This setting allows the current to be stably detected.

The current detection timing is calculated after the voltage instruction value calculation portion, and therefore the timing of the current detection in the next control period can be appropriately set by calculating the setting of the carrier period of the next control period by the time of the voltage instruction value calculation portion during the present control period.

In the control of the motor using the alternating-current circuit, control (the coordinate conversion) that handles an alternating-current device as if this device is a direct-current device with use of the alternating current flowing in the motor and the rotational angle signal is generally used. This control is called the vector control. This control is a method that handles the alternating-current circuit by converting the alternating-current device into the direct-current device by the time the voltage for realizing desired current responsiveness is calculated, and, further, handles the alternating-current circuit by converting the direct-current device into the alternating-current device by the time the alternating-current voltage to be actually applied to the motor, i.e., the switching timing is specified.

Then, in this vector control, a technique for realizing the stable control is established by an ability to detect where the rotational angle of the motor is located when the current is detected, and, further, where the rotational angle of the motor is located when the voltage is output. However, generally, the timing at which the current is detected and the timing at which the rotational angle of the motor is detected cannot be synchronized with each other due to specifications of the microcomputer and the like, and, further, the processing of the conversion from the direct-current device to the alternating-current device is already ended by the timing at which the voltage is output, which prohibits the synchronization between the timing at which the voltage is output and the timing at which the rotational angle of the motor is detected.

As a correction thereof, for a rotational angle for the conversion of the current from the alternating current to the direct current, the rotational angle is corrected by calculating a rotational advance angle (or retard angle) of the motor advanced (or retarded since the rotational angle detection timing until the current detection timing from a time lag between the rotational angular velocity and the detection timing, and adding it to the detected rotational angle. More specifically, the phase compensation a portion 13 calculates a phase θe1(k) for the three-phase dq-axis conversion in the following manner with use of the motor electric angle θe0(k), the calculated electric angular velocity ωe(k), and the calculated time lag ΔTadIθ(k) between the detection timings. The motor electric angle θe0(k) is detected as if the current and the signal of the rotational angle are detected at the same timing for the coordinate conversion despite the fact that they are actually acquired at different timings although these timings fall within the present control period.

Figure 4:
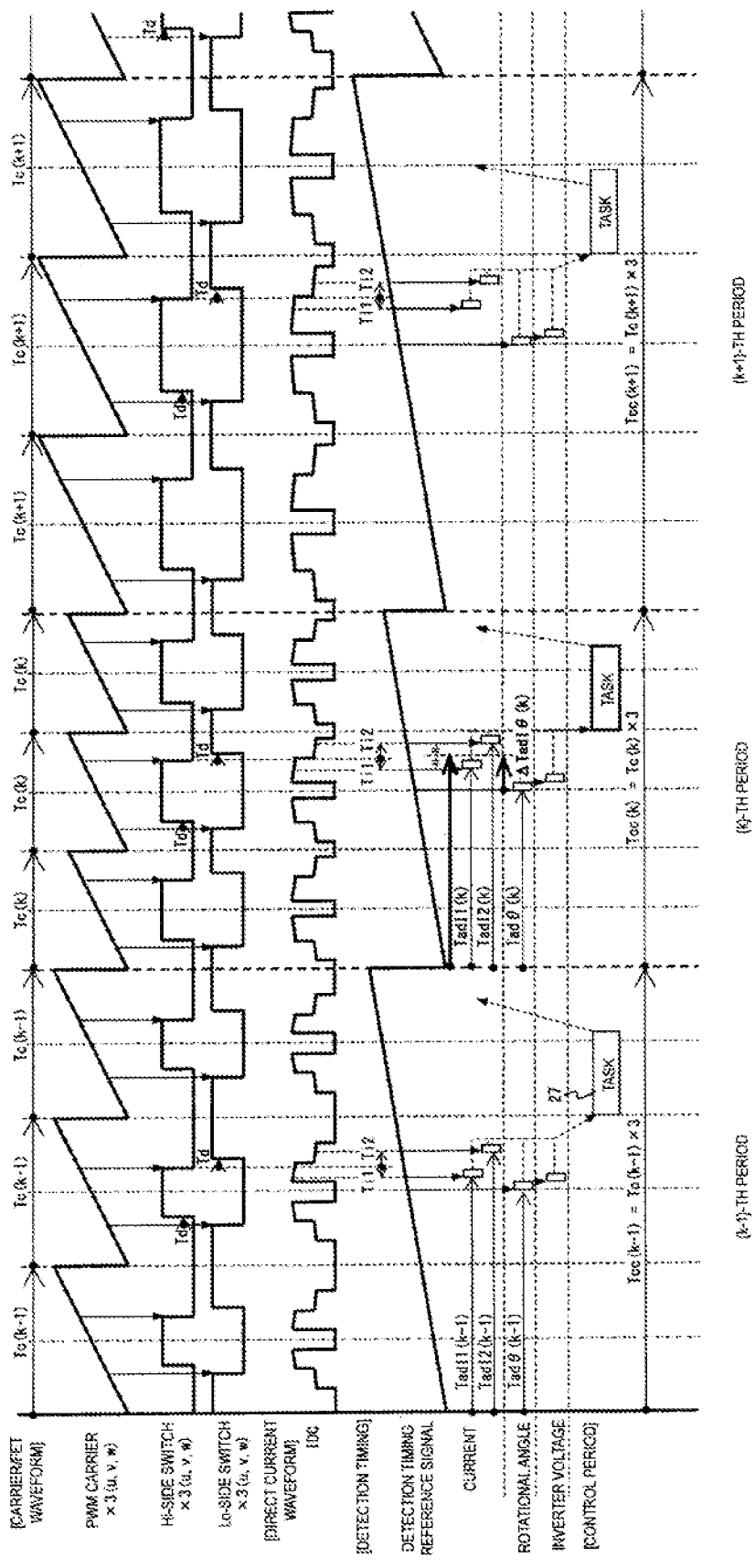
FIG. 4 illustrates a timing chart of phase compensation for a three-phase dq-axis coordinate conversion according to the embodiment.
Figure 5:
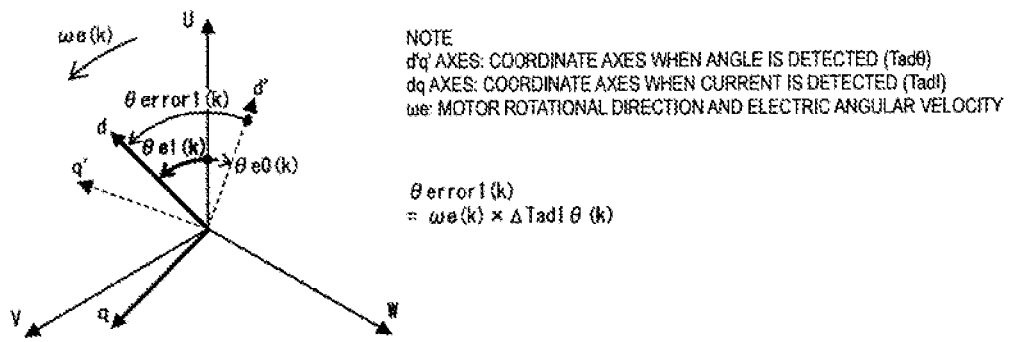
FIG. 5 is a vector diagram illustrating an image of a lag between a current detection timing and a rotational angle detection timing according to the embodiment.

FIG. 4 illustrates a timing chart of phase compensation for the three-phase dq-axis coordinate conversion, and FIG. 5 illustrates a vector diagram indicating an image of the lag between the current detection timing and the rotational angle detection timing. Now, the timing at which the current is detected is assumed to be a middle point between TadI1(k) and TadI2(k). The following equations are derived from FIGS. 4 and 5.

$$\theta e1(k)[\text{rad}] = \theta e0(k)[\text{rad}] + \theta \text{error1}[\text{rad}]$$
$$= \theta e0(k)[\text{rad}] + \omega e(k)[\text{rad}/s] \times \Delta TadI\theta(k)[\text{sec}]$$
$$= \theta e0(k)[\text{rad}] + \omega e(k)[\text{rad}/s] \times$$
$$[\{TadI1(k)[\text{sec}] + TadI2(k)[\text{sec}]\}/2 - Tad\theta(k)[\text{sec}]\}]$$

Figure 7:
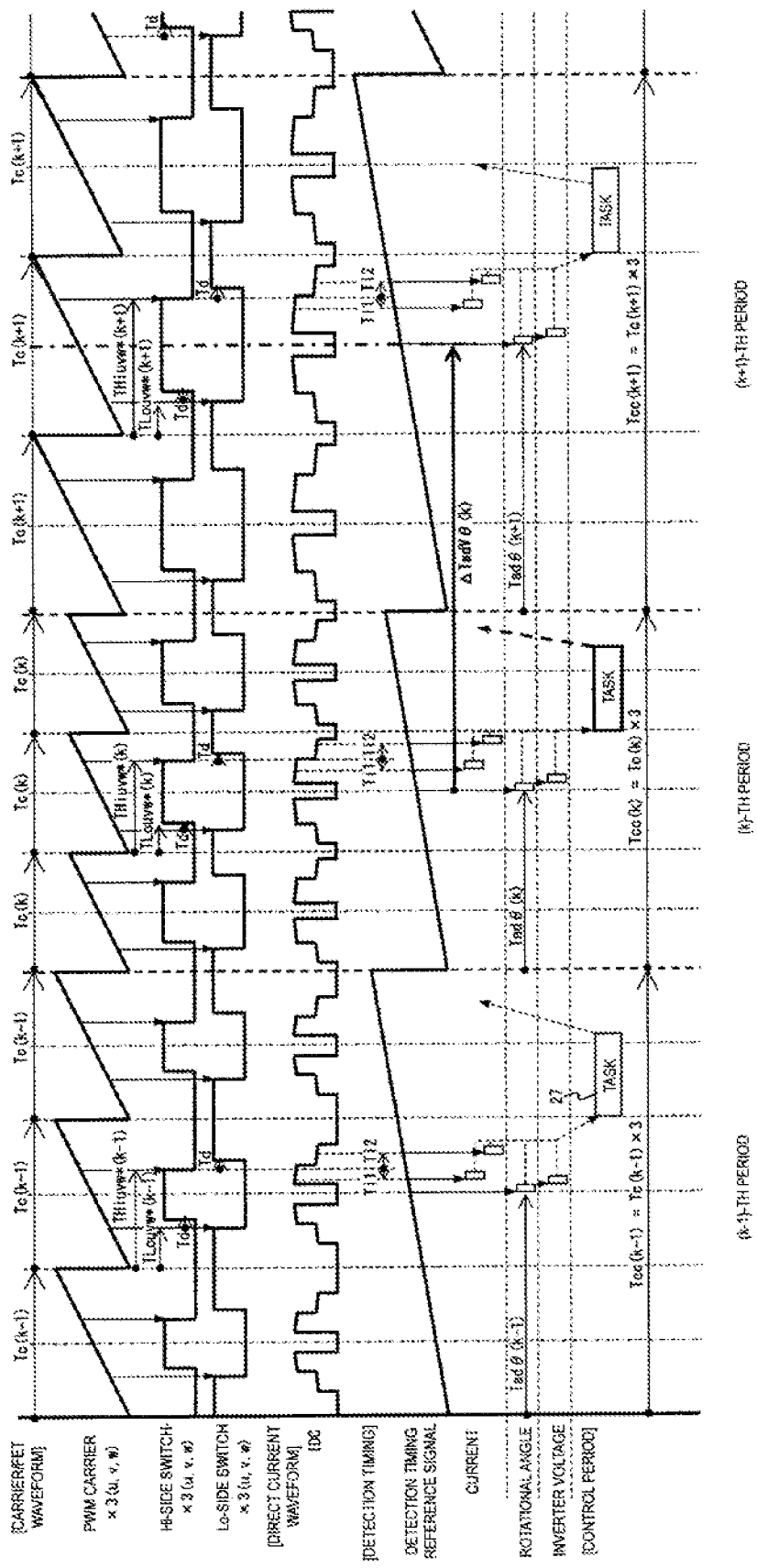
FIG. 7 is a timing chart of the control apparatus according to the embodiment.
Figure 8:
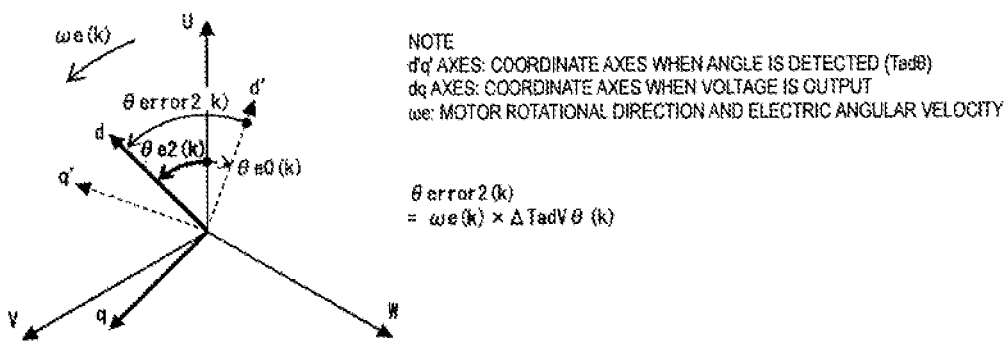
FIG. 8 is a vector diagram illustrating an image of a lag between a voltage output timing and the rotational angle detection timing according to the embodiment.

Further, for a rotational angle for the conversion of the voltage from the direct-current voltage to the alternating-current voltage, the rotational angle is corrected by calculating a rotational advance angle of the motor advanced since the rotational angle detection timing until the voltage output period from a time lag between the rotational angular velocity and the detection timing, and adding it to the detected rotational angle. More specifically, the phase compensation b portion 16 calculates a phase θe2(k) for the dq-axis three-phase conversion in the following manner with use of the detected motor electric angle θe0(k), the calculated electric angular velocity ωe(k), and the calculated time lag ΔTadVθ(k) between the timings so as to synchronize, for the coordinate conversion, the detection timing of the rotational angle acquired during the present control period and the timing at which the three-phase voltages are output in the next control period to return the voltage instructions converted into the dq axes and calculated by the vector control into the three-phase coordinate system. FIG. 7 illustrates a timing chart regarding the time lag ΔTadVθ(k) between the timings, and FIG. 8 illustrates a vector diagram indicating an image of the lag between the voltage output timing and the rotational angle detection timing. Now, the outputs of the three-phase voltages (the switching timings) are fixed during one control period, and therefore a target timing for the synchronization is set to a middle point during the voltage output period. The following equations are derived from FIGS. 7 and 8.

$$\theta e2(k)[\text{rad}] = \theta e0(k)[\text{rad}] + \theta \text{error2}[\text{rad}]$$
$$= \theta e0(k)[\text{rad}] + \omega e(k)[\text{rad}/s] \times \Delta TadV\theta(k)[\text{sec}]$$
$$= \theta e0(k)[\text{rad}] + \omega e(k)[\text{rad}/s] \times$$
$$\left[\{Tcc(k)[\text{sec}] - Tad\theta(k)[\text{sec}]\} + \frac{1}{2} \times Tcc(k+1)[\text{sec}]\right]$$

These calculations allow the control apparatus to perform further ideal vector control. Now, the current and the rotational angle are detected at timings before the present control period, and the rotational angle for the conversion of the current from the alternating current to the direct current is corrected in front of the voltage instruction value calculation portion, so that the carrier period of the next control period does not have to be updated before the present correction. The rotational angle is detected at a timing before the present control period while a target for the voltage output period is set on a timing during the next control period, and the rotational angle for the conversion of the voltage from the direct-current voltage to the alternating-current voltage is corrected in the rear of the voltage instruction value calculation portion, so that the phase of the voltage output in the next control period can be appropriately set by calculating the setting of the carrier period of the next control period by the time of the voltage instruction value calculation portion during the present control period.

Figure 6:
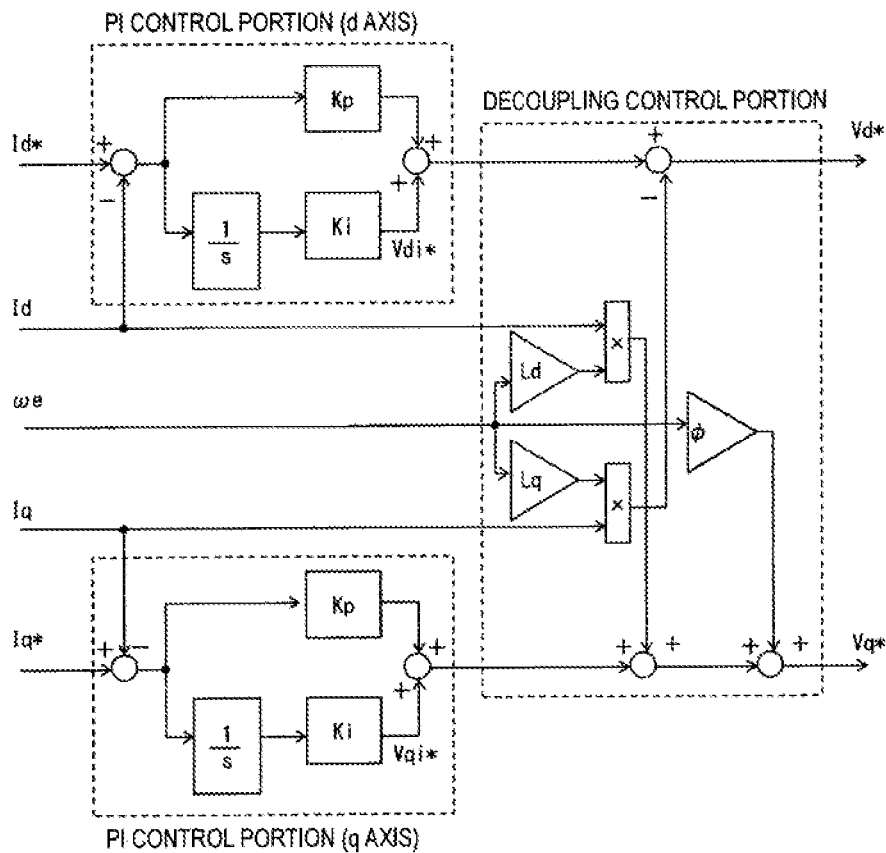
FIG. 6 illustrates a configuration of a voltage instruction value calculation portion according to the embodiment.

Next, the voltage instruction value calculation portion 15 employs PI control, which is often employed in feedback control of a current. I control in the PI control multiplies a value acquired by integrating a difference (a deviation signal) between the target current value and the detected current value by an integration gain, and outputs it as a voltage instruction value of the I control. In the discrete system, the integration of the above-described deviation signal means sequentially adding the above-described deviation signal for each control period (an integration time period). However, in the present embodiment using the changing control period, a stabilized voltage instruction value of the I control can be output by adjusting the integration gain according to the changing control period. FIG. 6 illustrates a configuration of the voltage instruction value calculation portion according to the present embodiment. In FIG. 6, a PI control portion calculates voltage instructions Vdi*(k+1) and Vqi*(k+1) to be actually output in the next control period by integrating deviations between instruction currents Id*(k) and Iq*(k) acquired in the present control period and detected currents Id(k) and Iq(k) acquired from the coordinate conversion in the present control period with respect to each of the d axis and the q axis, and multiplying them by an integration gain Ki. In the discrete system, due to the control period acquiring the changeability, the following consideration should be added so as to make the integration coefficient Ki thereof changeable in the integration calculation.

First, when a deviation product Iqersum[A·sec] is calculated, the calculation thereof is expressed by the following equation in the discrete system.

$$Iqersum(k)[A*Tcc(k)\sec]=Iqersum(k-1)[A*Tcc(k-1)\sec]+\{Iq*(k)[A]-Iq(k)[A]\}$$

Further, the voltage instruction value reflected during the next control period with use of this deviation product is expressed by the following equation.

$$Vqi^*(k+1)[V] = Iqersum(k)[A \cdot Tcc(k)sec] \times Ki(k)[V/A \cdot Tcc(k)sec]$$
$$= Iqersum(k)[A \cdot Tcc(k)sec] \times \{Tcc(k) \times Ki'(k)[V/A \cdot sec]\}$$

(Similar processing to the q axis is also performed for the d axis.) This calculation allows the control apparatus to also adjust the integration gain according to the changing control period, thereby performing appropriate PI control.

Next, regarding the switching timing setting portion 20, the desired voltage instruction necessary to realize the desired current responsiveness is calculated based on the current and the signal of the rotational angle detected during or by the present control period. Further, the switching timing that should be set in the next control period to realize the calculated desired voltage is determined by calculating the duty ratio from the supply voltage detected during or by the present control period, and determining the switching-on time to be provided in the next control period in such a manner that the calculated duty ratio and a ratio between the switching-on time and the switching-off time in the carrier period during the next control period match each other.

In other words, the switching timing is set in such a manner that the PWM Duty ratios Dutyu*(k), Dutyv*(k), and Dutyw*(k) for each phase that are acquired from the three-phase voltage instruction values Vu*(k), Vv*(k), and Vw*(k) calculated during the present control period and the inverter voltage value Vinv(k), and the ratios between the switching-on times Donu*(k), Donv*(k), and Donw*(k) and the switching-off times Doffu*(k), Doffv*(k), and Doffw*(k) during the PWM carrier period match each other. Further, the switching timing in the next control period is set based on a starting point of the PWM carrier period of the next control period in consideration of the dead time Td.

Figure 9:
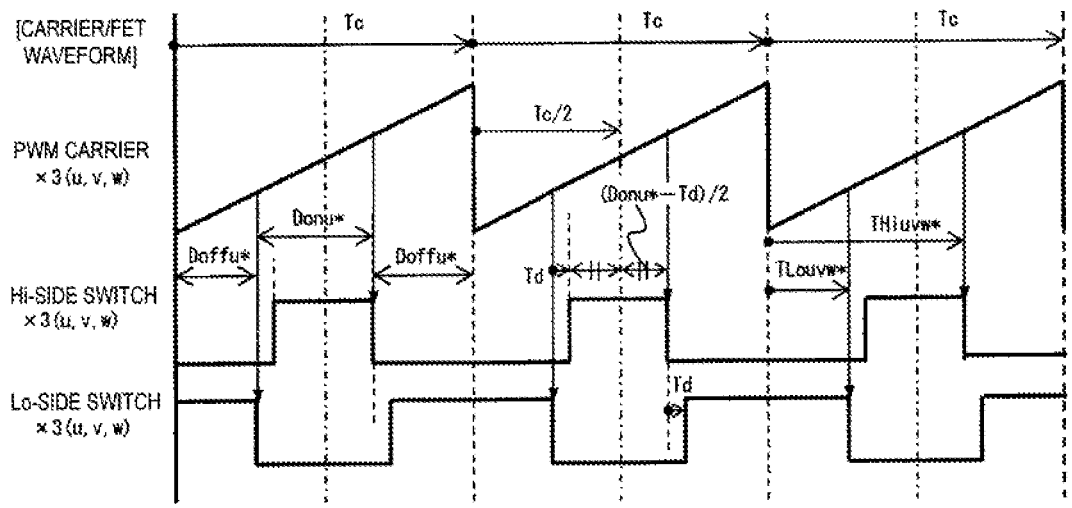
FIG. 9 illustrates switching timings according to the embodiment.

In the present embodiment, an operation of the switching-on time can be realized by setting the timing at which the Hi-side switch is switched off and the timing at which the Lo-side switch is switched off. This is because, regarding the Hi-side switch ON timing, the Hi-side switch is switched automatically by the microcomputer after the dead time Td has elapsed since the Lo-side switch OFF timing, and, regarding the Lo-side switch ON timing, the Lo-side switch is switched automatically by the microcomputer after the dead time Td has elapsed since the Hi-side switch OFF timing. Further, in the present embodiment, a switching waveform is generated in a center-aligned manner. FIG. 9 illustrates the switching timings according to the present embodiment. In FIG. 9, first, the switching-on time is calculated by the following equation.

$$Donu^*(k)=Dutyu^*(k) \times Tc(k+1)$$

Next, the Hi-side switch OFF timing and the Lo-side switch OFF timing are set.

$$THiu^*(k+1) = Tc(k+1) \div 2 + (Donu^*(k) - Td) \div 2$$
$$= \{Tc(k+1) + Donu^*(k)\} \div 2 - Td \div 2$$
$$TLou^*(k+1) = Tc(k+1) \div 2 - (Donu^*(k) - Td) \div 2 - Td$$
$$\{Tc(k+1) - Donu^*(k)\} \div 2 - Td \div 2$$

This calculation allows the control apparatus to stably apply the desired voltage even when the control cycle is changeable, thereby securing the desired current responsiveness. Because the switching timing setting portion carries out the calculation in the rear of the voltage instruction value calculation portion, the switching-on time in the next control period can be appropriately set by calculating the setting of the carrier period of the next control period by the time of the voltage instruction value calculation portion during the present control period.

In this manner, the switching timing setting portion sets the switching timings based on the control period. This setting allows the control apparatus to also adjust the switching timings according to the changing control period, thereby performing appropriate duty control.

Next, the detection timing setting portion 22 calculates timings Tad1(k+1) and Tad2(k+2) of the current detection carried out in the second PWM carrier period during the next control period at the timing earlier by Ti1 [sec] and the timing later by Ti2 [sec] than the signal corresponding to the middle (THiM) when the Hi-side switching-off timings THiu*(k+1), THiv*(k+1), and THiw*(k+1) of the three phases, of the timings of the Hi-side and Lo-side switches of the three phases to be reflected during the next control period, which are calculated during the present control period, are arranged in descending order of the timing (=in descending order of Duty) like the latest timing (THiB), the middle timing (THiM), and the earliest timing (THiS). Further, the detection timing setting portion 22 calculates the timing Tadθ(k+1) of the rotational angle detection carried out during the next control period. Regarding the inverter voltage detection timing TadV, the inverter voltage is detected immediately after the rotational angle is detected and therefore the setting of the timing thereof is purposely omitted. The following equations are derived from FIG. 2.

The current detection timings are set by the following equations.

$$Tad1(k+1)=Tc(k+1)+THiM-Ti1$$

$$Tad2(k+1)=Tc(k+1)+THiM+Ti2$$

The rotational angle detection timing is set by the following equation.

$$Tadθ(k+1)=Tc(k+1)\times(3/2)$$

Next, the carrier frequency setting portion 24 will be described. In the present embodiment, the carrier frequency setting portion 24 is constructed by studying in advance a modulation period and a modulation width of the carrier frequency that can reduce the electromagnetic noise, and preparing in advance a pattern of a PWM carrier period realizing it as an integer multiple of the PWM carrier period. The carrier frequency setting portion constantly switches this PWM carrier period prepared in advance for each control period since the electric power steering is started up until the electric power steering is shut down.

Then, the carrier frequency setting portion 24 sets the PWM carrier period according to a state of a steering operation. This setting allows the control apparatus to appropriately control the motor by setting the carrier frequency according to the steering state, such as employing the PWM carrier period prioritizing a reduction in radio noise in such a state that the steering assist is not carried out, like when the vehicle is not steered because being stopped or when the vehicle is running straight, while setting the carrier frequency to a relatively low frequency at the time of sudden steering like emergency avoidance or in a case like when the steering operation at a large output is frequently performed for parking the vehicle into a garage.

Further, the carrier frequency setting portion 24 sets the PWM carrier period so as to change the PWM carrier period into each of a shorter period and a longer period than a specific period across the specific period after setting the PWM carrier period to the specific period. This setting causes the control apparatus to changeably control the PWM carrier period so as to set a PWM carrier period including both the longer period and the shorter period across the specific period, thereby distributing a peak of energy at the switching timing and thus succeeding in reducing the radio noise.

Figure 10:
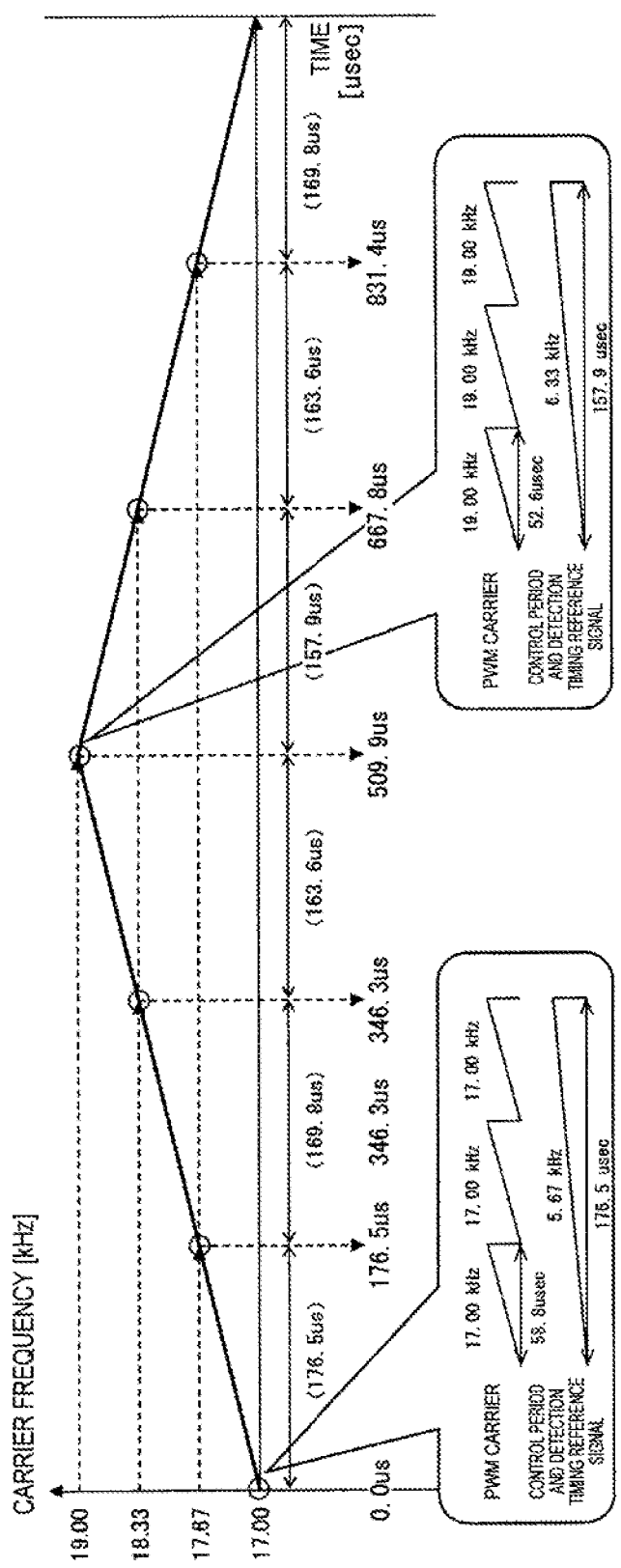
FIG. 10 illustrates a concept of a setting of a carrier frequency for a spread spectrum according to the embodiment.

FIG. 10 illustrates a concept of the setting of the carrier frequency for the spread spectrum according to the present embodiment. In FIG. 10, the carrier frequency prepared in advance is modulated per period of approximately 1 ms in a frequency band from 17 kHz to 19 kHz having an average frequency of 18 kHz and a modulation width of 2 kHz. In the present embodiment, target current control responsiveness is set to 1 ms, and the control period is set in such a manner that one control period corresponds to three PWM carrier periods and the application voltage and the control period are updated per control period so that the application voltage is updated five or more times within this target responsiveness. In other words, there are six times of modulation during the modulation period of 1 ms, and the carrier frequency to be set is set by equally dividing a modulation frequency starting from 17 kHz, reaching 19 Hz, and then returning to 17 kHz into six frequencies (17.00 kHz, 17.67 kHz, 18.33 kHz, 19.00 kHz, 18.33 kHz, and 17.67 kHz).

Figure 11:
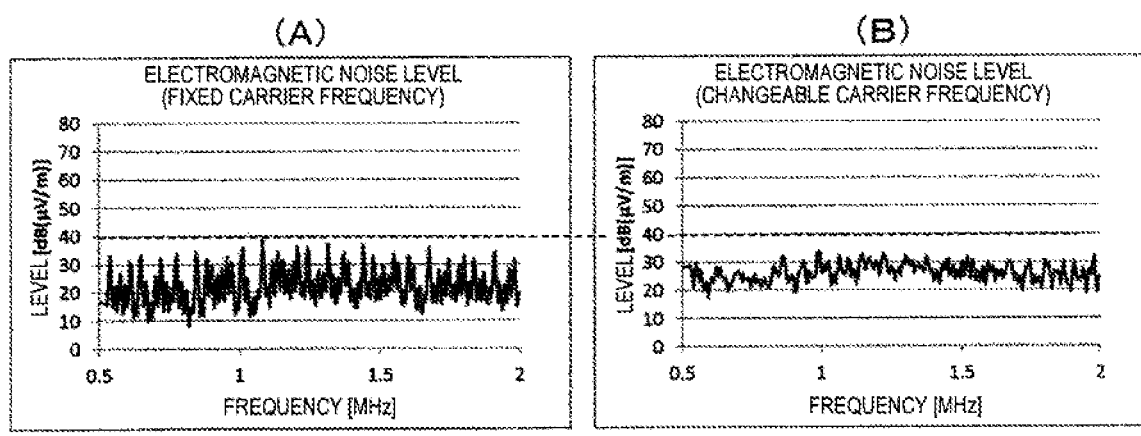
FIG. 11 illustrates a result of a simulation of an effect of the spread spectrum of electromagnetic noise due to changeability of the carrier frequency according to the embodiment.

FIG. 11 illustrates a result of a simulation of an effect of the spread spectrum of the electromagnetic noise due to the changeability of the carrier frequency according to the present embodiment. FIG. 11(A) illustrates an electromagnetic noise level in the case of the fixed carrier frequency, and FIG. 11(B) illustrates an electromagnetic noise level in the case of the changeable carrier frequency. As clearly understood from FIG. 11, the present embodiment can spread the spectrum as expected to reduce the electromagnetic noise, thereby realizing the stable motor control.

In the above-described manner, the present embodiment is a control apparatus for a power steering apparatus. The control apparatus is configured to drive and control a motor configured to provide a steering force to a steering mechanism configured to turn a turning target wheel according to a steering operation performed on a steering wheel. The control apparatus includes a current instruction value calculation portion configured to calculate a current instruction value directed to the motor according to a driving condition of a vehicle, a voltage instruction value calculation portion configured to calculate a voltage instruction value directed to the motor based on the current instruction value, a PWM control portion configured to output a PWM duty signal to each phase of the motor according to the voltage instruction value, a bridge circuit including a switching element configured to be driven and controlled by the PWM duty signal, and configured to drive and control the motor, a control period setting portion configured to changeably set a control period, which is a period based on which the control apparatus performs a control operation, a carrier frequency setting portion configured to set a natural number of PWM carrier periods, each of which is a period based on which the PWM duty signal is switched between on and off, within one period of the control period, and also configured to changeably set a length of the PWM carrier period, a current detection portion configured to detect a motor current, which is a current flowing in the motor, during the control period, a rotational angle detection portion configured to detect a motor rotational angle, which is a rotational angle of a rotor of the motor, during the control period, and a detection timing setting portion configured to set a timing at which the motor current is detected by the current detection portion or a timing at which the motor rotational angle is detected by the rotational angle detection portion, based on the control period set by the control period setting portion.

Further, the present embodiment is a power steering apparatus including a steering mechanism configured to turn a turning target wheel according to a steering operation performed on a steering wheel, a motor configured to provide a steering force to the steering mechanism, and the control apparatus configured to drive and control the motor.

Due to this configuration, the present embodiment allows both the PWM carrier period and the control period to be changeably set, thereby improving flexibility of the setting of the PWM carrier period compared to employing the constant control period. Therefore, for example, the present embodiment can reduce the limitations when the carrier frequency is changeably set for the purpose of reducing the so-called radio noise, and reduce the switching loss by setting the carrier frequency to a low frequency when a large output is provided. On the other hand, the present embodiment also unintentionally causes a change in the timing of the detection of the motor current or the motor rotational angle, which is carried out at the predetermined timing during the control period, but can carry out the detection at a desired detection timing by setting this timing per control period changed based on the control period set by the control period setting portion.

Having described the embodiment, the present invention is not limited to the above-described embodiment, and includes various modifications. For example, the above-described embodiment has been described in detail to facilitate better understanding of the present invention, and the present invention is not necessarily limited to the configuration including all of the described features. Further, the individual components described in the claims and the specification can be arbitrarily combined or omitted within a range that allows them to remain capable of achieving at least a part of the above-described objects or producing at least a part of the above-described advantageous effects.

The present application claims priority to Japanese Patent Application No. 2016-034015 filed on Feb. 25, 2016. The entire disclosure of Japanese Patent Application No. 2016-034015 filed on Feb. 25, 2016 including the specification, the claims, the drawings, and the abstract is incorporated herein by reference in its entirety.

REFERENCE SIGN LIST

1: direct-current power source
2: smoothing capacitor
3: switching element
4: three-phase bridge circuit
5: shunt resistance
6: motor
7: rotor angle sensor
8: inverter voltage sensor
9: control apparatus
10: current detection portion
11: rotational angle detection portion
12: angular velocity calculation portion
13: phase compensation a portion
14: three-phase dq-axis conversion portion
15: voltage instruction value calculation portion
16: phase compensation b portion
17: dq-axis three-phase conversion portion
18: inverter voltage detection portion
19: PWM control portion
20: switching timing setting portion
21: microcomputer switching signal generation portion
22: detection timing setting portion
23: microcomputer signal detection portion
24: carrier frequency setting portion
25: control period setting portion
26: current instruction value calculation portion
27: task

The invention claimed is:

1. A control apparatus for a power steering apparatus, the control apparatus being configured to drive and control a brushless motor configured to provide a steering force to a steering mechanism configured to turn a turning target wheel according to a steering operation performed on a steering wheel, the control apparatus comprising:
a current instruction value calculation portion configured to calculate a current instruction value directed to the brushless motor according to a driving condition of a vehicle;
a voltage instruction value calculation portion configured to calculate a voltage instruction value directed to the brushless motor based on the current instruction value;
a PWM control portion configured to output a PWM duty signal to each phase of the brushless motor according to the voltage instruction value;
a bridge circuit including a switching circuit configured to be driven and controlled by the PWM duty signal, the bridge circuit being configured to drive and control the brushless motor;
a control period setting portion configured to changeably set a control period, the control period being a period based on which the control apparatus performs a control operation;
a PWM carrier period setting portion configured to set a natural number of PWM carrier periods within one period of the control period, the PWM carrier period being a period based on which the PWM duty signal is switched between on and off, the PWM carrier period setting portion being further configured to changeably set a length of the PWM carrier period;
a motor current detection execution portion configured to detect a motor current, which is a current flowing in the brushless motor, during the control period;
a motor rotational angle detection execution portion configured to detect a motor rotational angle, which is a rotational angle of a rotor of the brushless motor, during the control period;
an execution timing setting portion configured to set a timing at which the motor current is detected by the motor current detection execution portion or a timing at which the motor rotational angle is detected by the motor rotational angle detection execution portion, based on the control period set by the control period setting portion; and
a motor rotational angle estimation portion configured to estimate the motor rotational angle when the motor current is detected by the motor current detection execution portion, based on the control period set by the control period setting portion and the motor rotational angle detected by the motor rotational angle detection execution portion,
wherein the current instruction value calculation portion is configured to calculate the current instruction value based on the motor current and the motor rotational angle when the motor current is detected.

2. The control apparatus for the power steering apparatus according to claim 1, further comprising a digital filtering processing portion configured to perform filtering processing on a signal of the motor current or a signal of the motor rotational angle,
wherein the digital filtering processing portion is configured to set a cutoff frequency to be used when the filtering processing is performed, based on the control period.

3. The control apparatus for the power steering apparatus according to claim 2, wherein the current instruction value calculation portion is configured to calculate the current instruction value by PI control based on the motor current, and to set an integration gain in the PI control based on the control period.

4. The control apparatus for the power steering apparatus according to claim 1, further comprising a switching timing setting portion configured to set a timing at which the PWM duty signal is switched between on and off,
wherein the switching timing setting portion is configured to set the switching timing based on the control period.

5. The control apparatus for the power steering apparatus according to claim 1, wherein the PWM carrier frequency setting portion is configured to set the PWM carrier period according to a state of the steering operation.

6. The control apparatus for the power steering apparatus according to claim 5, wherein the PWM carrier frequency setting portion is configured to set the PWM carrier period to a specific period, and subsequently, set the PWM carrier period so as to change the PWM carrier period into each of a shorter period and a longer period than the specific period across the specific period.

7. A power steering apparatus comprising:
a steering mechanism configured to turn a turning target wheel according to a steering operation performed on a steering wheel;
a brushless motor configured to provide a steering force to the steering mechanism; and
a control apparatus configured to drive and control the brushless motor, the control apparatus including
a current instruction value calculation portion configured to calculate a current instruction value directed to the brushless motor according to a driving condition of a vehicle;
a voltage instruction value calculation portion configured to calculate a voltage instruction value directed to the brushless motor based on the current instruction value;
a PWM control portion configured to output a PWM duty signal to each phase of the brushless motor according to the voltage instruction value;
a bridge circuit including a switching circuit configured to be driven and controlled by the PWM duty signal, the bridge circuit being configured to drive and control the brushless motor;
a control period setting portion configured to changeably set a control period, the control period being a period based on which the control apparatus performs a control operation;
a PWM carrier period setting portion configured to set a natural number of PWM carrier periods within one period of the control period, the PWM carrier period being a period based on which the PWM duty signal is switched between on and off, the PWM carrier period setting portion being further configured to changeably set a length of the PWM carrier period;
a motor current detection execution portion configured to detect a motor current, which is a current flowing in the brushless motor, during the control period;
a motor rotational angle detection execution portion configured to detect a motor rotational angle, which is a rotational angle of a rotor of the brushless motor, during the control period;
an execution timing setting portion configured to set a timing at which the motor current is detected by the motor current detection execution portion or a timing at which the motor rotational angle is detected by the motor rotational angle detection execution portion, based on the control period set by the control period setting portion; and
a motor rotational angle estimation portion configured to estimate the motor rotational angle when the motor current is detected by the motor current detection execution portion, based on the control period set by the control period setting portion and the motor rotational angle detected by the motor rotational angle detection execution portion,
wherein the current instruction value calculation portion is configured to calculate the current instruction value based on the motor current and the motor rotational angle when the motor current is detected.

8. The power steering apparatus according to claim 7, wherein the control apparatus further includes a digital filtering processing portion configured to perform filtering processing on a signal of the motor current or a signal of the motor rotational angle, and
wherein the digital filtering processing portion is configured to set a cutoff frequency to be used when the filtering processing is performed, based on the control period.

9. The power steering apparatus according to claim 8, wherein the current instruction value calculation portion is configured to calculate the current instruction value by PI control based on the motor current, and set an integration gain in the PI control based on the control period.

10. The power steering apparatus according to claim 7, wherein the control apparatus further includes a switching timing setting portion configured to set a timing at which the PWM duty signal is switched between on and off, and
wherein the switching timing setting portion is configured to set the switching timing based on the control period.

11. The power steering apparatus according to claim 7, wherein the PWM carrier frequency setting portion is configured to set the PWM carrier period according to a state of the steering operation.

12. The power steering apparatus according to claim 11, wherein the PWM carrier frequency setting portion is configured to set the PWM carrier period to a specific period, and subsequently set the PWM carrier period so as to change the PWM carrier period into each of a shorter period and a longer period than the specific period across the specific period.

13. A system to control a brushless motor for power steering, the system comprising:
a control apparatus configured to
calculate a current instruction value for the brushless motor according to a driving condition of a vehicle;
calculate a voltage instruction value for the brushless motor based on the current instruction value;
output a pulse width modulation (PWM) duty signal to each phase of the brushless motor according to the voltage instruction value;
set a control period based on which the control apparatus performs a control operation;
set a natural number of PWM carrier periods within one period of the control period, at least one PWM carrier period of the PWM carrier periods being a period based on which the PWM duty signal is switched between an on state and an off state, and set a length of the at least one PWM carrier period;
detect a motor current and a motor rotational angle of the brushless motor during the control period;
set a timing at which the motor current or the motor rotational angle is detected, based on the set control period;
estimate the motor rotational angle when the motor current is detected, based on the set control period and the detected motor rotational angle; and
calculate the current instruction value based on the motor current and the motor rotational angle when the motor current is detected, and
a bridge circuit configured to control the brushless motor, the bridge circuit including a switching circuit configured to be driven and controlled by the PWM duty signal.

* * * * *